(12) United States Patent
Bhattacharyya

(10) Patent No.: US 7,671,407 B2
(45) Date of Patent: *Mar. 2, 2010

(54) EMBEDDED TRAP DIRECT TUNNEL NON-VOLATILE MEMORY

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/103,287

(22) Filed: Apr. 15, 2008

(65) Prior Publication Data

US 2009/0200601 A1  Aug. 13, 2009

Related U.S. Application Data

(63) Continuation of application No. 11/065,778, filed on Feb. 25, 2005, now Pat. No. 7,365,388.

(51) Int. Cl.
*H01L 29/792* (2006.01)
(52) U.S. Cl. .................. 257/324; 257/411
(58) Field of Classification Search ................ 257/324, 257/411
See application file for complete search history.

(56) References Cited

U.S. PATENT DOCUMENTS

| | | | |
|---|---|---|---|
| 4,870,470 A | 9/1989 | Bass et al. | |
| 5,414,287 A | 5/1995 | Hong | |
| 6,756,634 B2 | 6/2004 | Helm et al. | |
| 6,927,145 B1 | 8/2005 | Yang et al. | |
| 7,365,388 B2 * | 4/2008 | Bhattacharyya | 257/324 |
| 2006/0192242 A1 | 8/2006 | Bhattacharyya | |

OTHER PUBLICATIONS

D. Marsushita et al.; Novel Fabrication Process to Realize Ultra-thin (EOT = 0.7nm) and Ultra-low Leakage SiON Gate Dielectrics; 2004 Symposium on VLSI Technology Digest of Technical Papers ;pp. 172-173; Advanced LSI Technology Laboratory and Semiconductor Company, Toshiba Corporation.

J.H. Lee et al.; Effect Polysilicon Gate on the Flatband Voltage Shift and Mobility Degradation for ALD-Al$_2$O$_3$ Gate Dielectric; 2000; CPU Technology Team, System LSI Division Samsung Electronics Co. Ltd.; pp. 28.3.1-28.3.4.

(Continued)

*Primary Examiner*—Howard Weiss
(74) *Attorney, Agent, or Firm*—Leffert Jay & Polglaze, P.A.

(57) ABSTRACT

The cell comprises a substrate having a drain region and a source region. An oxynitride layer is formed over the substrate. An embedded trap layer is formed over the oxynitride layer. An injector layer is formed over the embedded trap layer. A high dielectric constant layer is formed over the injector layer. A polysilicon control gate formed over the high dielectric constant layer. The cell can be formed in a planar architecture or a two element, split channel, three-dimensional device. The planar cell is formed with the high dielectric constant layer and the control gate being formed over and substantially around three sides of the embedded trap layer. The split channel device has a source line in the substrate under each trench and a bit line on either side of the trench.

20 Claims, 4 Drawing Sheets

OTHER PUBLICATIONS

Dana Lee et al.; Vertical floating-gate 4.5F$^2$ Split-gate NOR Flash Memory at 110nm Node; Silicon Storage Technology, Inc. and PowerChip Semiconductor Corporation; 2004 Symposium on VLSI Technology Digest of Technical Papers; pp. 72-73.

K. Tsunoda et al.; Ultra-High Speed Tunneling Memory (DTM) for Embedded RAM Applications; Fujitsu Laboratories Ltd.,; 2004 Symposium on VLSI Technology Digest of Technical Papers; pp. 153-153.

* cited by examiner

EMBEDDED TRAP DIRECT TUNNEL NON-VOLATILE MEMORY

RELATED APPLICATION

This application is a Continuation of U.S. application Ser. No. 11/065,778, titled "EMBEDDED TRAP DIRECT TUNNEL NON-VOLATILE MEMORY," filed Feb. 25, 2005, U.S. Pat. No. 7,365,388, which is commonly assigned and incorporated herein by reference.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), synchronous dynamic random access memory (SDRAM), dynamic random access memory (DRAM), and flash memory.

Conventional DRAM cells are comprised of a switching transistor and an integrated storage capacitor tied to the storage node of the transistor. Charge storage is enhanced by providing appropriate storage capacity in the form of a stacked capacitor or a trench capacitor in parallel with the depletion capacitance of the floating storage node. DRAM cells are volatile and therefore lose data when the power is removed.

DRAMs use one or more arrays of memory cells arranged in rows and columns. Each of the rows of memory cells is activated by a corresponding row line that is selected from a row address. A pair of complementary digit lines are provided for each column of the array and a sense amplifier coupled to the digit lines for each column is enabled responsive to a respective column address. The sense amplifier senses a small voltage differential between the digit lines and amplifies such voltage differential.

Due to finite charge leakage across the depletion layer, the capacitor has to be recharged frequently to ensure data integrity. This is referred to in the art as refreshing and can be accomplished by periodically coupling the memory cells in the row to one of the digit lines after enabling the sense amplifiers. The sense amplifiers then restore the voltage level on the memory cell capacitor to a voltage level corresponding to the stored data bit. The permissible time between refresh cycles without losing data depends on various factors such as rate of charge dissipation in the memory capacitor.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

For code applications, a faster performing, less dense NOR cell is typically employed. For data storage applications, a slower performing, denser NAND cell configuration is typically employed.

As computers become smaller and their performance increases, the computer memories also need to increase performance to prevent them from becoming data bottlenecks. However, flash memory devices present a challenge for speed increases. A flash cell, or other non-volatile memory cell, programs (writing and erasing) considerably slower than a DRAM cell and has a relatively limited endurance (write/erase cycle capability) when compared to a DRAM. However, increasing the speed of a DRAM presents problems since the DRAM cells cannot be accessed during a refresh operation.

For the reasons stated above, and for other reasons stated below which will become apparent to those skilled in the art upon reading and understanding the present specification, there is a need in the art for a higher performance and higher endurance non-volatile memory device that can bridge the application gap between DRAM and non-volatile memory devices.

DETAILED DESCRIPTION

Figure 1:
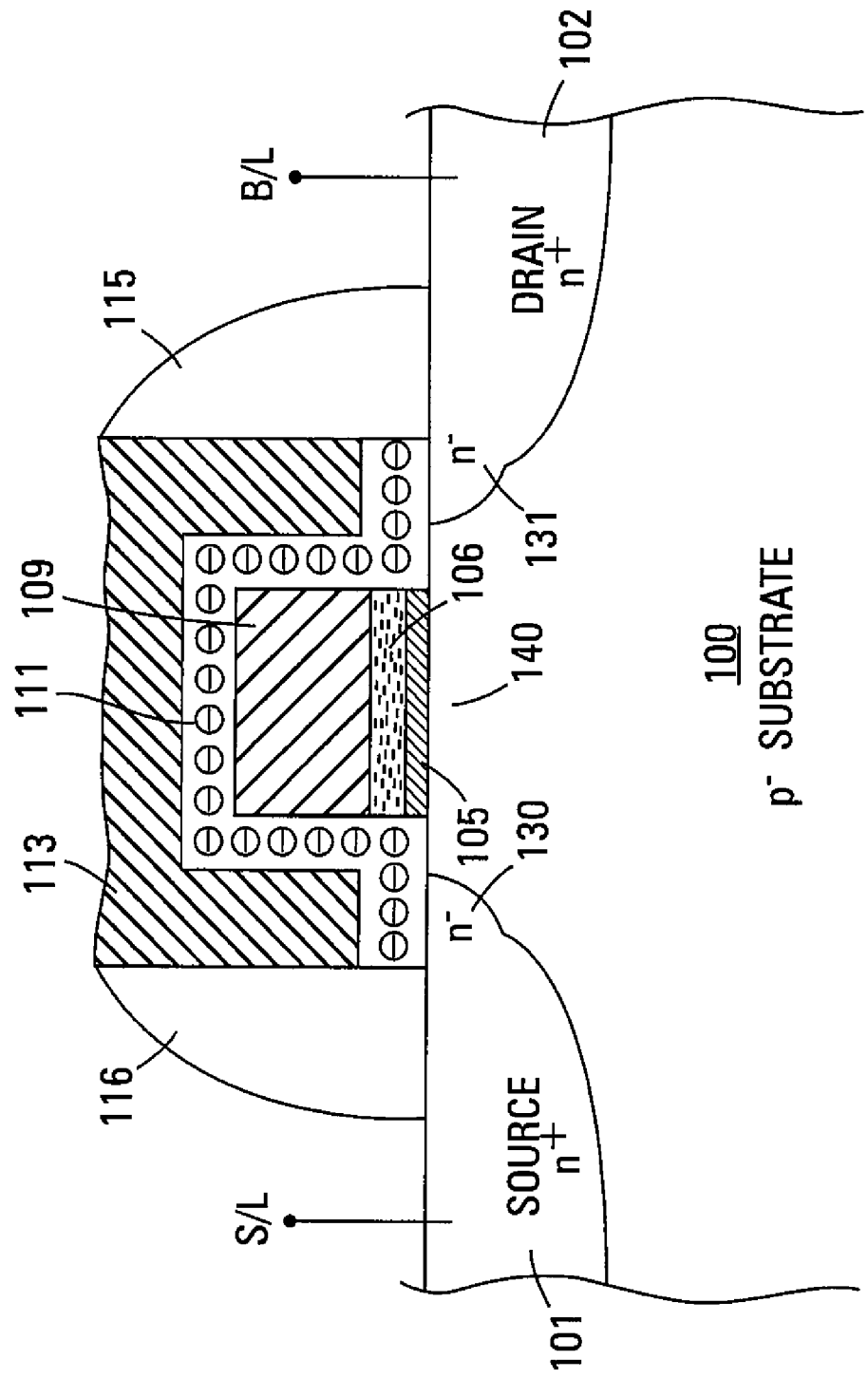
FIG. 1 shows a cross-sectional view of one embodiment of a planar non-volatile memory device of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

The embodiments of the present invention are modified direct tunnel memory (DTM) devices that use an embedded trap region for storing a charge. This significantly improves memory density as well as memory retention by several orders of magnitude over the prior art, providing a non-volatile memory while maintaining high program/erase speeds and the infinite endurance of DTM. These benefits are accomplished by replacing the floating gate of a typical non-volatile memory with a relatively thin layer of embedded-trap oxynitride or metal nano-dot insulator to provide an efficient control gate to floating node coupling.

The memory devices of the present invention can be implemented in both planar and three-dimensional architectures as discussed in the subsequent figures. The three-dimensional embodiment has the added benefits of providing a contactless, virtual ground array for high bit density configurations.

FIG. 1 illustrates a cross-sectional view of one embodiment of the planar non-volatile memory device of the present invention. For purposes of clarity, this figure shows only one memory cell. It is well known in the art that a typical memory device may be comprised of millions or more of these cells.

The planar cells are fabricated on a substrate 100. In one embodiment, the substrate 100 is a p-type silicon. In an alternate embodiment, the substrate 100 is an n+ type silicon.

Doped diffusion regions 101, 102 are created in the substrate 100 for the source and drain regions. If the substrate is a p-type material, the diffusion areas 101, 102 are n+ conductivity. However, an alternate embodiment could use an n-type substrate thus requiring heavily doped p-type diffusion regions 101, 102. The diffusion regions 101, 102 act as source lines 101 and bit lines 102, depending on the direction of operation of the memory string. While the left diffusion region 101 is shown as being the source line, if the cell is operated in the opposite direction, the right diffusion region 102 can operate as the source line while the left diffusion region 101 would be the bit line.

A channel region 140 is located in the substrate 100 between each source line and bit line diffusion area 101, 102. As is well known in the art, these are the regions 140 in which the channels form during operation of the memory cells.

A floating stack is formed over the substrate 100. The floating stack is comprised of an oxynitride layer 105, a trapping layer 106, and an injector layer 109.

The oxynitride layer 105, in one embodiment, is comprised of a scalable SiON layer 105 that provides charge retention. This layer is approximately 1.5 nm thick with an atomic concentration of $Si:O:N \approx 1 : \geq 1.3 : \leq 0.5$, and a refractive index in the range of 1.5-1.6. This layer provides an improvement in charge leakage as compared to an equivalent thickness of $SiO_2$. In an alternate embodiment, this single layer may be replaced by multiple layers of direct tunnel dielectric of increasing band-offset and increasing higher dielectric constant (K). This would further improve the speed and charge retention of DTM.

The embedded trapping layer 106, in one embodiment, is a layer of embedded trap oxynitride or a metal nano-dot insulator layer. This provides longer charge retention in the deep quantum-well trap that is thus formed.

The oxynitride material might be SiON formed to a thickness in the range of 4.5-5.0 nm with a refractive index of approximately 1.8. The metal nano-dot elements can include Platinum (Pt), Iridium (Ir), Gold (Au), Cobalt (Co), Tungsten (W) or some other metal that provides deep energy electron and hole traps.

In one embodiment, the metal nano-dot layer 106 is deposited by sputtering or evaporation at relatively low temperatures. The density range of the metal nano-dots in the trapping layer 106 can be in the range of $2 \times 10^{12}$ to $10 \times 10^{13}$ with typical dot sizes in the range of 1-5 nm and spaced greater than 3 nm apart in the high-K dielectric material. Alternate embodiments can use different densities, dot sizes, and spacing.

The injector layer 109 that is formed over the embedded trap layer 106 can be comprised of a silicon rich nitride (SRN) that is highly conductive. This layer 109 acts as a top floating electrode while chemically passivating the lower embedded trap layer 106. The injector SRN 109 provides a large vertical interface between the floating node and the control gate, thus further enhancing the voltage coupling between the two.

The injector SRN 109, in one embodiment, is formed to a thickness in the range of 10-15 nm and has a refractive index of 2.5-2.7. This layer 109 can be deposited by low temperature chemical vapor deposition (CVD) or atomic layer deposition (ALD). Alternate embodiments may use other thicknesses and/or methods of deposition.

The floating stack is separated from the wrapped, polysilicon control gate 113 by a high-K coupling medium of thin layers 111 of oxide plus $Al_2O_3$ (K=10) oxide/$HfO_2$ (K=24), oxide/$ZrO_2$ (K=24), oxide/$Pr_2O_3$ (K=30), or oxide/$TiO_2$ (K=60). The material next to silicon causes a fixed negative charge in the layer 111 that helps to hold leakage that would normally leak out from the trap layer 106 and provides enhanced coupling between the control gate 113 and the embedded floating trap layer 106. This layer 111 also provides enhanced voltage scalability over a typical DTM device. Portions 130, 131 of the diffusion areas 101, 102 near this layer 111 are changed into n− areas by the fixed negative charge.

The polysilicon control gate 113 is bordered on each side by sidewall spacers 115, 116. In one embodiment, the spacers 115, 116 are comprised of $SiO_2$. Alternate embodiments may use other materials.

The embodiments of the memory cells of the present invention are not limited to any one predetermined architecture. The cells can be used in NAND arrays, NOR arrays, AND arrays, direct tunnel memory for DRAM devices, virtual gate arrays (VGA), and other types of memory architectures.

Figure 2:
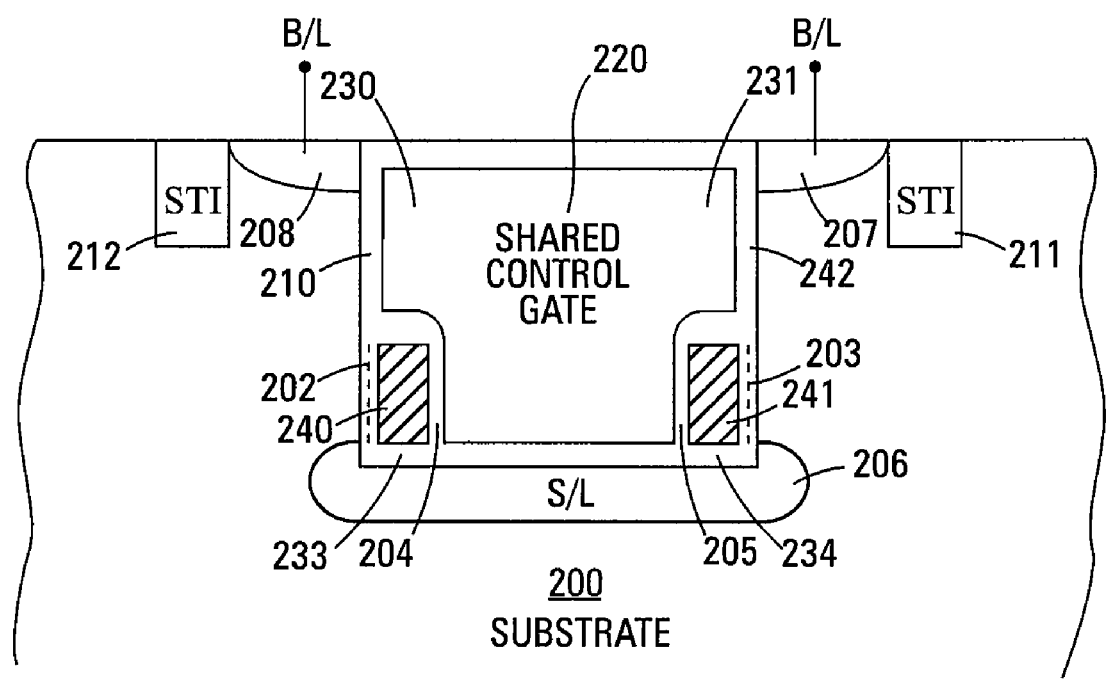
FIG. 2 shows a cross-sectional view of one embodiment of a three-dimensional, two-element, split channel non-volatile memory device of the present invention.

FIG. 2 illustrates a cross-sectional view of one embodiment of a three-dimensional, two-element, split channel non-volatile memory device of the present invention. This embodiment uses substantially the same floating gate stack of the embodiment of FIG. 1 in a vertical, split channel, two-element configuration.

The vertical enhanced DTM cell is comprised of a trench formed in a silicon substrate 200. The trench contains two non-volatile cells, each comprised of a fixed threshold element 230, 231 in series with a bi-stable DTM element 233, 234, respectively. The fixed threshold elements 230, 231 provide over erasure protection and lower operating power requirements.

A shared control gate 220 is formed in the trench and separated from the trench sidewalls and the bi-stable elements by an oxide layer 210, 242. A shared source line 206 is formed in the substrate under the trench. Bit lines 207, 208 are formed in the substrate near the surface between the shallow trench isolation 211, 212 and the trench sidewalls.

Each bi-stable element 233, 234 is comprised of substantially the same DTM tunnel/trap layer 202, 203 as discussed with reference to FIG. 1. In this embodiment, the high-K layer 204, 205 and the control gate 220 may or may not wrap around the bottom edge of the injector SRN layers 240, 241. The shared control gate 220 design provides two NOR non-volatile memory bits per trench without requiring any direct metal contact for the control gate 220 and the shared source line 206 within the cell. Such contacts are made outside the cell, thus enhancing array density. This provides a density potential of less than $3F^2$ for a NOR DTM cell.

The fixed threshold elements are not required for proper operation of the embodiment of FIG. 2. In an alternate embodiment, the bi-stable elements could be located on each sidewall and share the common control gate 220.

Figure 3:
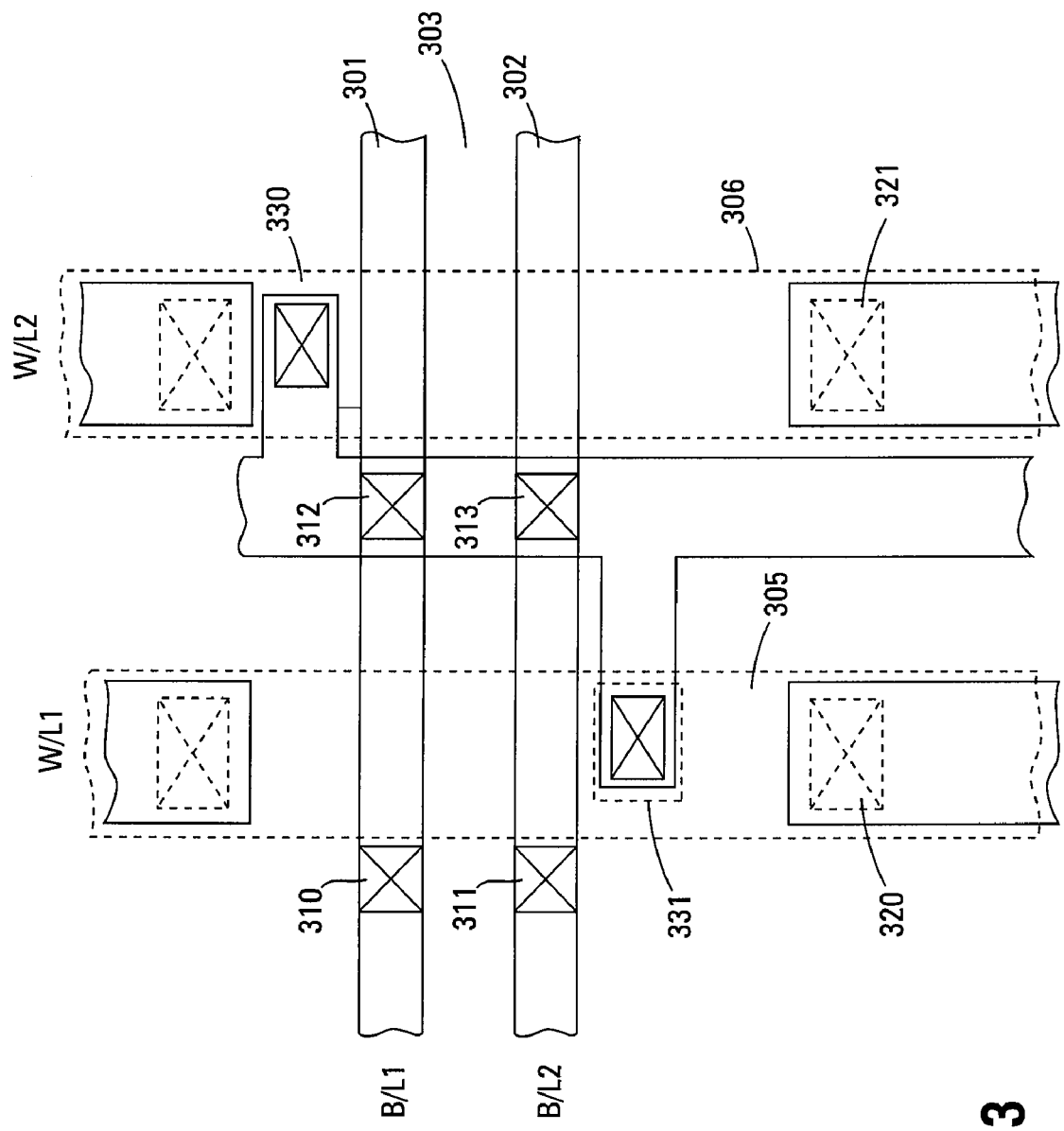
FIG. 3 shows a top layout view of a memory array in accordance with the embodiment of FIG. 2.

FIG. 3 illustrates a top layout view of the memory array in accordance with the embodiment of FIG. 2. For illustration purposes, only two word lines and two bit lines are shown within the array. This view shows two first metal (M1) level bit lines 301, 302 that are separated by an isolation region 303. The polysilicon word lines W/L1 and W/L2 305, 306 run substantially perpendicular to the bit lines 301, 302.

Shared source line contacts 330, 331 are formed outside the array and are connected by the second level metal (M2) as shown. Word line contacts 320, 321 are also strapped by the second metal level M2 for word lines 305, 306, respectively, to reduce word line resistance. These contacts are also formed outside of the array to enhance bit density. Self-aligned bit line contacts 310-313 are formed into the bit lines 301, 302.

Figure 4:
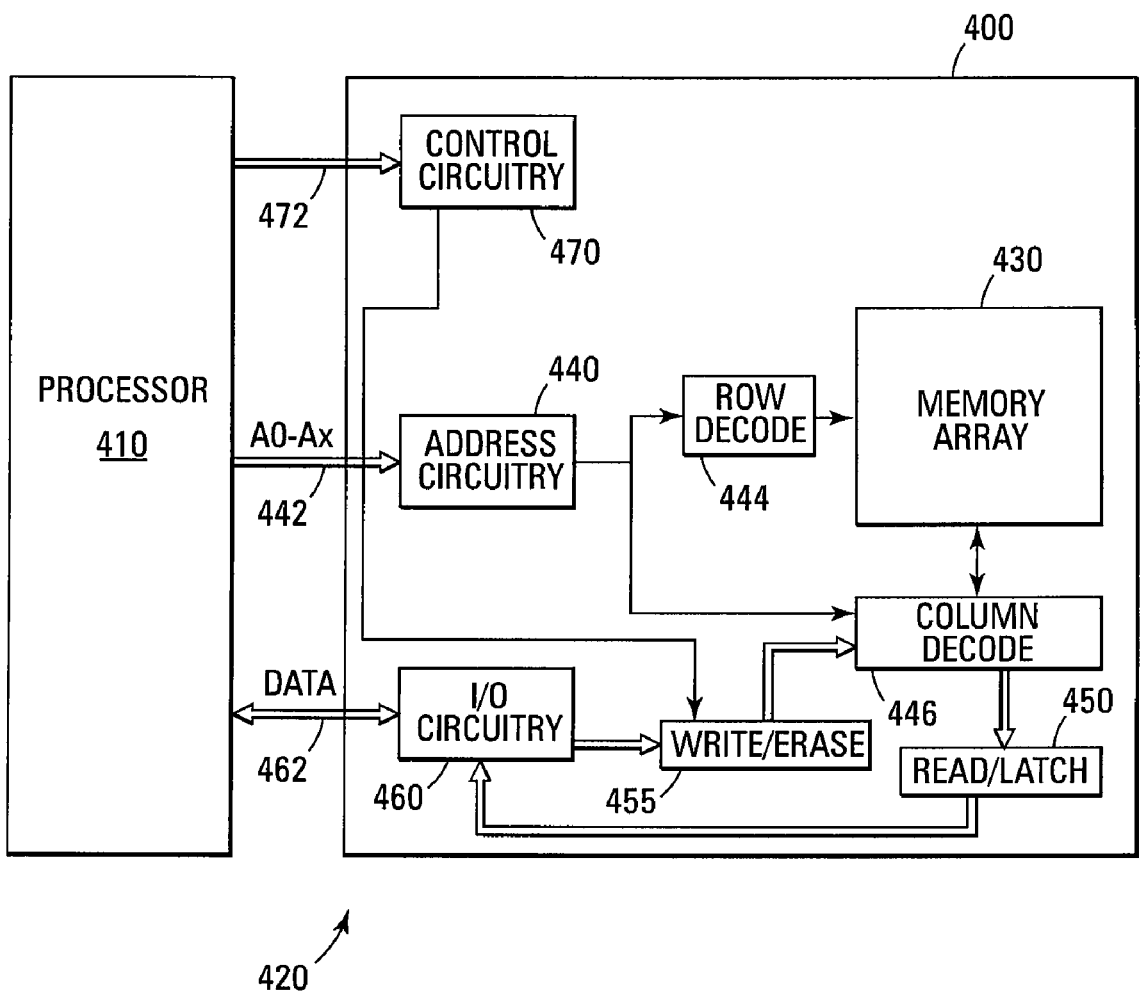
FIG. 4 shows a block diagram of one embodiment of an electronic system of the present invention.

FIG. 4 illustrates a functional block diagram of a memory device 400 that can incorporate an array of the embedded trap DTM non-volatile memory cells of the present invention. The memory device 400 is coupled to a processor 410. The processor 410 may be a microprocessor or some other type of controlling circuitry. The memory device 400 and the processor 410 form part of an electronic system 420. The memory device 400 has been simplified to focus on features of the memory that are helpful in understanding the present invention.

The memory device includes an array of memory cells 430 that can be comprised of the embodiments of the embedded trap DTM non-volatile memory cells that were previously illustrated. The memory array 430 is arranged in banks of rows and columns as illustrated in FIG. 3. The gates of each row of memory cells are coupled with a word line while the drain and source connections of the memory cells are coupled to bit lines.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense/buffer circuitry 450. The sense/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write (program), and erase operations. The control circuitry 470 may be a state machine, a sequencer, or some other type of controller.

The memory device illustrated in FIG. 4 has been simplified to facilitate a basic understanding of the features of the memory. A more detailed understanding of internal circuitry and functions of memories are known to those skilled in the art.

CONCLUSION

The embodiments of the present invention provide a scalable, "embedded trap DTM" non-volatile device that can replace typical DRAM devices. These devices improve upon typical prior art DRAM devices since they only need refreshing approximately once an hour, require 200-300 orders of magnitude less power than a typical DRAM device, and can be programmed/erased faster than a typical prior art DRAM device.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
   injector material formed over and in contact with an embedded trap;
   coupling material formed around the injector material and in contact with a substrate that comprises a source region and a drain region; and
   a control gate formed over the coupling material.

2. The memory device of claim 1 wherein the drain and source regions are n+ regions.

3. The memory device of claim 1 wherein the injector material is a silicon rich nitride.

4. The memory device of claim 1 wherein the memory device is formed vertically in a trench corner of the substrate and along a sidewall of the trench.

5. The memory device of claim 4 and further including a fixed threshold element formed vertically along the sidewall.

6. The memory device of claim 1 wherein the coupling material is comprised of oxide and one of: $Al_2O_3$, $HfO_2$, $ZrO_2$, $Pr_2O_3$, or $TiO_2$.

7. The memory device of claim 1 and further comprising an oxynitride material formed as a tunnel dielectric between the substrate and the embedded trap.

8. The memory device of claim 1 wherein the embedded trap is comprised of a metal nano-dot insulator layer.

9. The memory device of claim 8 wherein a density range of the metal nano-dots in the embedded trap is in the range of $2 \times 10^{12}$ to $10 \times 10^{13}$ and the nano-dots are spaced apart greater than 3 nm in a high-K dielectric material.

10. The memory device of claim 9 wherein the metal nano-dot insulator layer is comprised of one of Platinum (Pt), Iridium (Ir), Gold (Au), Cobalt (Co), Tungsten (W) with a dot size in the range of 1-5 nm.

11. A planar memory device comprising:
    a substrate comprising a plurality of pairs of diffusion regions;
    embedded trap oxynitride material formed over the substrate between each pair of diffusion regions;
    injector silicon rich nitride material formed over and in contact with each embedded trap oxynitride material;
    coupling material formed over and substantially surrounding each injector silicon rich nitride material, adjacent to each embedded trap oxynitride material, and in contact with the substrate and overlapping each diffusion region of each pair of diffusion regions; and
    a polysilicon control gate formed over and substantially surrounding each coupling material.

12. The memory device of claim 11 wherein the coupling material is comprised of a fixed negative charge.

13. The memory device of claim 11 wherein injector silicon rich nitride material is comprised of a vertical interface between the embedded trap oxynitride material and the control gate such that the voltage coupling is enhanced between the injector silicon rich nitride material and the embedded trap oxynitride material.

14. A memory device comprising:
- a substrate comprising a plurality of trenches, each sidewall of each trench being adjacent to a diffusion region formed in the substrate at the top of each trench and each trench bottom formed over and adjacent to a source line diffusion area;
- a bi-stable memory element formed along each sidewall of each trench, the bi-stable memory element comprising:
  - a tunnel dielectric material formed in contact with the sidewall;
  - embedded trap oxynitride material formed over and in contact with the tunnel dielectric material;
  - injector silicon rich nitride material formed over and in contact with the embedded trap oxynitride material; and
  - coupling material formed around the injector silicon rich nitride material and adjacent to the embedded trap oxynitride material such that coupling between the embedded trap oxynitride material and a control gate is enhanced; and
- a fixed threshold element formed along each sidewall and in series with the bi-stable memory element of the respective sidewall, the fixed threshold element sharing the control gate with the bi-stable memory element that is formed in the trench between opposing sidewalls and over the bi-stable memory elements and the fixed threshold elements.

15. The device of claim 14 wherein the control gate is formed over the bi-stable and fixed threshold elements on each sidewall of each trench such that the control gate is shared amongst all of the elements in the trench.

16. The device of claim 14 wherein the fixed threshold elements are comprised of the control gate separated from the trench sidewall by an oxide layer.

17. A memory system comprising:
- controlling circuitry that controls operation of the memory system; and
- a memory array, coupled to the controlling circuitry, the memory array formed in a substrate and comprising a plurality of memory devices wherein each memory device comprises:
  - a drain region and a source region formed in the substrate;
  - injector material formed over and in contact with an embedded trap;
  - coupling material formed around the injector material and the embedded trap and in contact with the substrate; and
  - a polysilicon control gate formed over the coupling material.

18. The system of claim 17 wherein the memory array is further coupled to memory control circuitry that controls operation of the memory array and operates in response to the system controlling circuitry.

19. The system of claim 17 wherein the memory array is organized in a NAND architecture.

20. The system of claim 17 wherein the memory array is a non-volatile memory array organized in one of a NOR architecture, an AND architecture, or a virtual gate array architecture.

* * * * *